US012598889B2

(12) United States Patent
Zhang et al.

(10) Patent No.: US 12,598,889 B2
(45) Date of Patent: Apr. 7, 2026

(54) DISPLAY PANEL AND MANUFACTURING METHOD THEREFOR, AND DISPLAY DEVICE

(71) Applicant: BOE Technology Group Co., Ltd., Beijing (CN)

(72) Inventors: Yongfeng Zhang, Beijing (CN); Guangcai Yuan, Beijing (CN); Xue Dong, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 497 days.

(21) Appl. No.: 18/029,411

(22) PCT Filed: Mar. 11, 2022

(86) PCT No.: PCT/CN2022/080347
§ 371 (c)(1),
(2) Date: Mar. 30, 2023

(87) PCT Pub. No.: WO2023/273406
PCT Pub. Date: Jan. 5, 2023

(65) Prior Publication Data
US 2023/0369539 A1 Nov. 16, 2023

(30) Foreign Application Priority Data
Jun. 30, 2021 (CN) .......................... 202110736098.7

(51) Int. Cl.
*H10K 59/38* (2023.01)
*H10H 20/813* (2025.01)
(Continued)

(52) U.S. Cl.
CPC ........... *H10K 59/38* (2023.02); *H10H 20/813* (2025.01); *H10H 20/816* (2025.01);
(Continued)

(58) Field of Classification Search
CPC ...... H10K 59/38; H10K 59/131; H10K 59/80; H10K 59/873; H10K 59/8792;
(Continued)

(56) References Cited

U.S. PATENT DOCUMENTS

| 2021/0184164 A1 | 6/2021 | Gong et al. | |
| 2021/0210658 A1 | 7/2021 | Cheng et al. | |
| 2023/0217711 A1* | 7/2023 | Lin ...................... | H10K 50/814 257/71 |

FOREIGN PATENT DOCUMENTS

| CN | 106803547 A | 6/2017 |
| CN | 107256878 A | 10/2017 |
| | (Continued) | |

*Primary Examiner* — Samuel A Gebremariam
(74) *Attorney, Agent, or Firm* — Banner & Witcoff, Ltd.

(57) ABSTRACT

Provided are a display panel and a manufacturing method therefor, and a display device. The display panel, including: a base substrate; and a plurality of sub-pixels, located on the base substrate, including a pixel circuit and a light-emitting element, wherein the light-emitting element is connected to the pixel circuit, the pixel circuit is configured to drive the light-emitting element; the light-emitting element includes: a first electrode; and a second electrode, electrically connected to the first electrode, the first electrode is closer to the base substrate than the second electrode.

20 Claims, 10 Drawing Sheets

(51) Int. Cl.

| | | |
|---|---|---|
| *H10H 20/816* | (2025.01) | |
| *H10H 20/851* | (2025.01) | |
| *H10H 20/854* | (2025.01) | |
| *H10H 20/857* | (2025.01) | |
| *H10H 29/14* | (2025.01) | |
| *H10K 59/131* | (2023.01) | |
| *H10K 59/80* | (2023.01) | |
| *H10K 71/00* | (2023.01) | |

(52) U.S. Cl.
CPC ........ *H10H 20/851* (2025.01); *H10H 20/854* (2025.01); *H10H 20/857* (2025.01); *H10H 29/142* (2025.01); *H10K 59/131* (2023.02); *H10K 59/80* (2023.02); *H10K 59/873* (2023.02); *H10K 59/8792* (2023.02); *H10K 71/00* (2023.02)

(58) Field of Classification Search
CPC .... H10K 71/00; H10H 20/813; H10H 20/816; H10H 20/851; H10H 20/854; H10H 20/857; H10H 29/142
See application file for complete search history.

(56) References Cited

FOREIGN PATENT DOCUMENTS

| CN | 108666343 A | 10/2018 |
|---|---|---|
| CN | 109841749 A | 6/2019 |
| CN | 113035902 A | 6/2021 |
| EP | 3490022 A1 | 5/2019 |

* cited by examiner

CB    CL

CL/CL1

Y

X

CB    CL/CL2

E20

E1

BS

DISPLAY PANEL AND MANUFACTURING METHOD THEREFOR, AND DISPLAY DEVICE

CROSS-REFERENCE TO RELATED APPLICATION

The application is a U.S. National Phase Entry of International Application PCT/CN2022/080347 filed Mar. 11, 2022, designating the United States of America and claiming priority to Chinese Patent Application No. 202110736098.7 filed Jun. 30, 2021. The present applications claim priority to and the benefit of the above-identified applications and the above-identified applications are incorporated by reference herein in their entirety.

TECHNICAL FIELD

At least one embodiment of the present disclosure relates to a display panel, a manufacturing method therefor, and a display device.

BACKGROUND

Compared with Liquid Crystal Display (LCD), Organic Light-Emitting Diode (OLED) device has the advantages of self-luminous, fast response, wide viewing angle, high brightness, bright in color, thin and light in weight, etc., and is considered to be the next generation display technology.

SUMMARY

At least one embodiment of the present disclosure relates to a display panel, a manufacturing method therefor, and a display device.

At least one embodiment of the present disclosure provides a display panel, including: a base substrate; and a plurality of sub-pixels, located on the base substrate, including a pixel circuit and a light-emitting element, the light-emitting element is connected to the pixel circuit, the pixel circuit is configured to drive the light-emitting element, the light-emitting element includes: a first electrode; and a second electrode, electrically connected to the first electrode, the first electrode is closer to the base substrate than the second electrode.

For example, the display panel further includes an inorganic layer, the inorganic layer is configured to protect the light-emitting element, the inorganic layer includes a first portion and a second portion, and a thickness of the first portion of the inorganic layer is different from a thickness of the second portion of the inorganic layer.

For example, the first portion of the inorganic layer overlaps with the second electrode in a direction perpendicular to the base substrate, the second portion of the inorganic layer does not overlap with the second electrode in the direction perpendicular to the base substrate, and the thickness of the first portion of the inorganic layer is greater than the thickness of the second portion of the inorganic layer.

For example, the inorganic layer includes a protective layer, and the protective layer is in contact with the second electrode.

For example, the inorganic layer further includes a first encapsulation thin film, and the first encapsulation thin film is in contact with the first electrode.

For example, materials of the protective layer and the first encapsulation thin film include inorganic insulating materials, respectively.

For example, the inorganic insulating material includes at least one selected from a group consisting of: silicon oxide, silicon nitride, and silicon oxynitride.

For example, the first encapsulation thin film is in contact with the protective layer, and the first encapsulation thin film is in contact with the second electrode.

For example, the display panel further includes a second encapsulation thin film, the second encapsulation thin film is located on the first encapsulation thin film and is in contact with the first encapsulation thin film, a material of the second encapsulation thin film includes an organic material, the second encapsulation thin film includes a first portion and a second portion, and a thickness of the first portion of the second encapsulation thin film is different from a thickness of the second portion of the second encapsulation thin film.

For example, the first portion of the second encapsulation thin film is in contact with the first portion of the inorganic layer, the second portion of the second encapsulation thin film is in contact with the second portion of the inorganic layer, and the thickness of the first portion of the second encapsulation thin film is smaller than the thickness of the second portion of the second encapsulation thin film.

For example, the display panel further includes a third encapsulation thin film, the third encapsulation thin film is located on the second encapsulation thin film.

For example, the light-emitting element further includes a third electrode and a light-emitting functional layer, the light-emitting functional layer is located between the third electrode and the first electrode, and the third electrode is closer to the base substrate than the first electrode, the light-emitting functional layer includes a hole injection layer, a hole transport layer, a charge generating layer, a first light-emitting layer, a second light-emitting layer, a third light-emitting layer, and an electron transport layer that are stacked, the first light-emitting layer is configured to emit light of a first color, the second light-emitting layer is configured to emit light of a second color, and the third light-emitting layer is configured to emit light of a third color, the third light-emitting layer is provided at a side of the charge generating layer, and the first light-emitting layer and the second light-emitting layer are provided at a side of the charge generating layer opposite to a side of the charge generating layer where the third light-emitting layer is provided, the light of the first color includes a green light, the light of the second color includes a red light, and the light of the third color includes a blue light.

For example, the second electrode includes a plurality of conductive lines and an opening region surrounded by the plurality of conductive lines, the light-emitting element includes a light-emitting region, and an orthographic projection of the light-emitting region on the base substrate overlaps with an orthographic projection of the opening region on the base substrate.

For example, a line width of each of the plurality of conductive lines ranges from 5 μm to 50 μm.

For example, a ratio of an overlapping area of an orthographic projection of the second electrode on the base substrate and the orthographic projection of the light-emitting region on the base substrate to an area of the orthographic projection of the light-emitting region on the base substrate is less than 10%.

For example, the second electrode further includes a plurality of conductive blocks, and the plurality of conductive blocks are electrically connected to the plurality of conductive lines, the plurality of conductive lines include a first conductive line extending in a first direction and a second conductive line extending in a second direction, a dimension of each of the plurality of conductive blocks in the first direction is larger than a dimension of the second conductive line in the first direction, a dimension of the conductive block in the second direction is larger than a dimension of the first conductive line in the second direction, and the first direction intersects with the second direction.

For example, the display panel further includes a plurality of pixel regions, the plurality of pixel regions are arranged in an array, each of the plurality of pixel regions includes a pixel group and a reserved region, and the pixel group includes at least three sub-pixels among the plurality of sub-pixels, and the conductive block corresponds to the reserved region.

For example, the plurality of sub-pixels includes a first sub-pixel, a second sub-pixel, and a third sub-pixel, and the pixel group includes the first sub-pixel, the second sub-pixel, and the third sub-pixel, the first sub-pixel, the second sub-pixel, and the third sub-pixel are arranged sequentially, an area of the light-emitting region of the second sub-pixel is smaller than an area of the light-emitting region of the first sub-pixel, the light-emitting region of the first sub-pixel is provided with a first notch, and the first notch is close to the light-emitting region of the second sub-pixel, and the reserved region includes a first reserved region, and the first reserved region is located at a side of the light-emitting region of the second sub-pixel and occupies a position of the first notch.

For example, an area of the first reserved region is greater than one third of the area of the light-emitting region of the second sub-pixel and smaller than or equal to the area of the light-emitting region of the first sub-pixel.

For example, the plurality of sub-pixels further includes a fourth sub-pixel, the fourth sub-pixel and the second sub-pixel are arranged at both sides of the third sub-pixel, respectively, and an area of the light-emitting region of the fourth sub-pixel is smaller than an area of the light-emitting region of the third sub-pixel, the light-emitting region of the third sub-pixel is provided with a second notch, and the second notch is close to the light-emitting region of the third sub-pixel, and the reserved region further includes a second reserved region, and the second reserved region is located at a side of the light-emitting region of the fourth sub-pixel and occupies a position of the second notch.

For example, an area of the second reserved region is greater than one third of the area of the light-emitting region of the fourth sub-pixel and smaller than or equal to the area of the light-emitting region of the third sub-pixel.

For example, a shape of the reserved region includes a rectangle.

For example, a resistivity of the second electrode is smaller than a resistivity of the first electrode, a material of the second electrode includes metal, and a material of the first electrode includes a metal oxide.

For example, the metal includes at least one selected from a group consisting of: aluminum, silver, molybdenum, titanium, copper, gold, and magnesium, and the metal oxide includes at least one selected from a group consisting of: indium zinc oxide, indium gallium zinc oxide, indium tin oxide, fluorine-doped tin oxide, zinc oxide, zinc aluminum oxide, tin zinc oxide, tin indium oxide, magnesium indium oxide, and cadmium indium oxide.

For example, the display panel further includes a black matrix and a color filter layer, the color filter layer includes a plurality of color filter portions, the black matrix is configured to separate the plurality of color filter portions, and an orthographic projection of the second electrode on the base substrate at least partially overlaps with an orthographic projection of the black matrix on the base substrate.

At least one embodiment of the present disclosure provides a method for manufacturing a display panel, including: forming a plurality of sub-pixels on a base substrate, forming the plurality of sub-pixels includes forming a pixel circuit and forming a light-emitting element, the light-emitting element being connected to the pixel circuit, and the pixel circuit being configured to drive the light-emitting element, forming the light-emitting element includes: forming a first electrode; and forming a second electrode; the second electrode is electrically connected to the first electrode, and the first electrode is closer to the base substrate than the second electrode.

For example, forming the second electrode includes: forming an electrode thin film on the first electrode; forming a protective thin film on the electrode thin film; forming a photoresist pattern on the protective thin film; and using the photoresist pattern as a mask and using the first electrode as an etching stop layer, patterning the protective thin film and the electrode thin film by using a same patterning process to form a protective layer and form the second electrode.

For example, forming the photoresist pattern is performed at a temperature less than 110° C., and etching the protective thin film and the electrode thin film is performed at a temperature less than 110° C.

For example, the manufacturing method further includes forming a first encapsulation thin film, the first encapsulation thin film is in contact with the protective layer, the first encapsulation thin film is in contact with the first electrode, the first encapsulation thin film and the protective layer constitute an inorganic layer, the inorganic layer includes a first portion and a second portion, and a thickness of the first portion of the inorganic layer is different from a thickness of the second portion of the inorganic layer.

At least one embodiment of the present disclosure provides a display device, including any one of the display panels as described above.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure without constituting any limitation thereto.

DETAILED DESCRIPTION

In order to make objectives, technical details, and advantages of the embodiments of the present disclosure clearer, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the described object is changed, the relative position relationship may be changed accordingly.

OLED components are usually composed of an anode, a light-emitting functional layer 213, and a cathode. According to the different light-emitting surfaces, the OLED components can be divided into two types: bottom emitting and top emitting. Because top-emitting components can obtain a larger aperture ratio, the top-emitting components have become a research hotspot in recent years.

For a large-sized top-emitting OLED display device, the voltage drop (IR-drop) caused by a large resistance of the cathode of the OLED component is likely to generate a display mura problem of uneven brightness with bright edges and dark center in the product, and the brightness uniformity of the product is poor.

The display panel provided by at least one embodiment of the present disclosure can reduce the IR-drop of a first electrode E1 of a light-emitting element (OLED component), so that the brightness of the product is uniform.

Figure 1A:
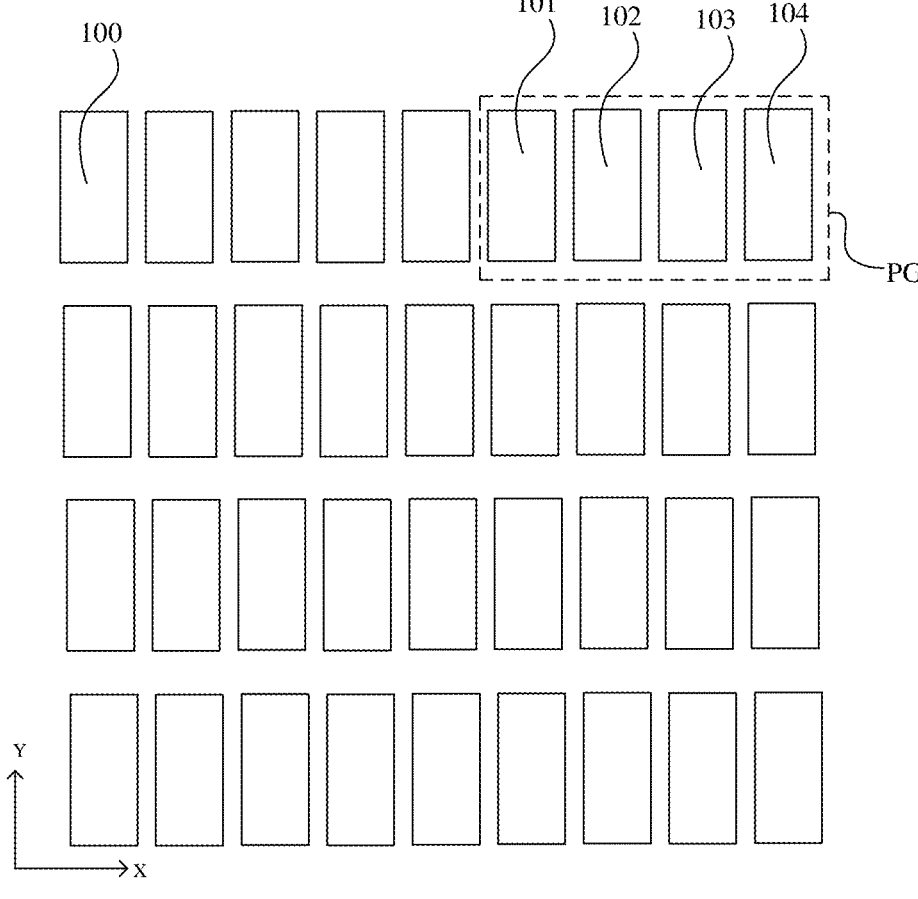
FIG. 1A is a schematic diagram of a pixel arrangement of a display panel.
Figure 1B:
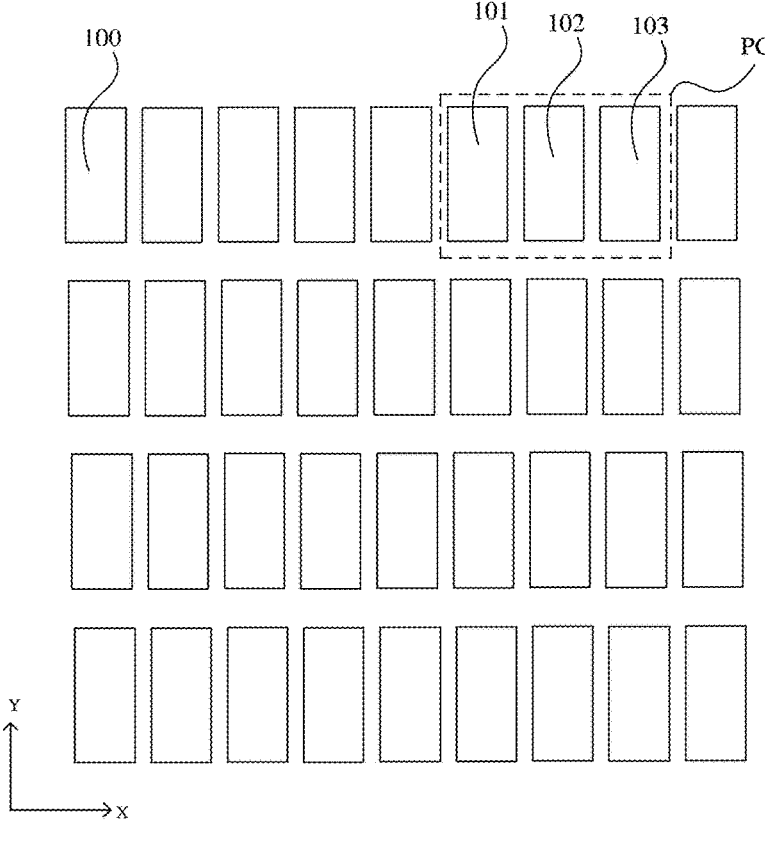
FIG. 1B is a schematic diagram of a pixel arrangement of a display panel.
Figure 2:
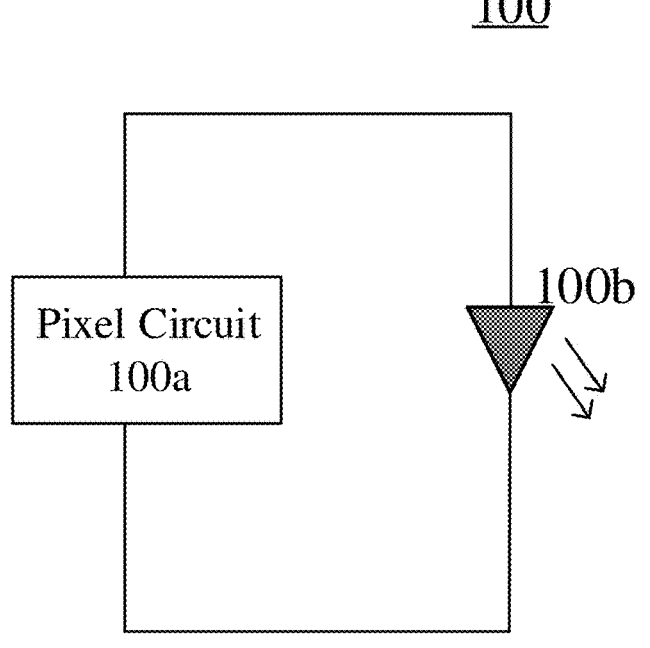
FIG. 2 is a schematic diagram of a sub-pixel in a display panel.
Figure 3:
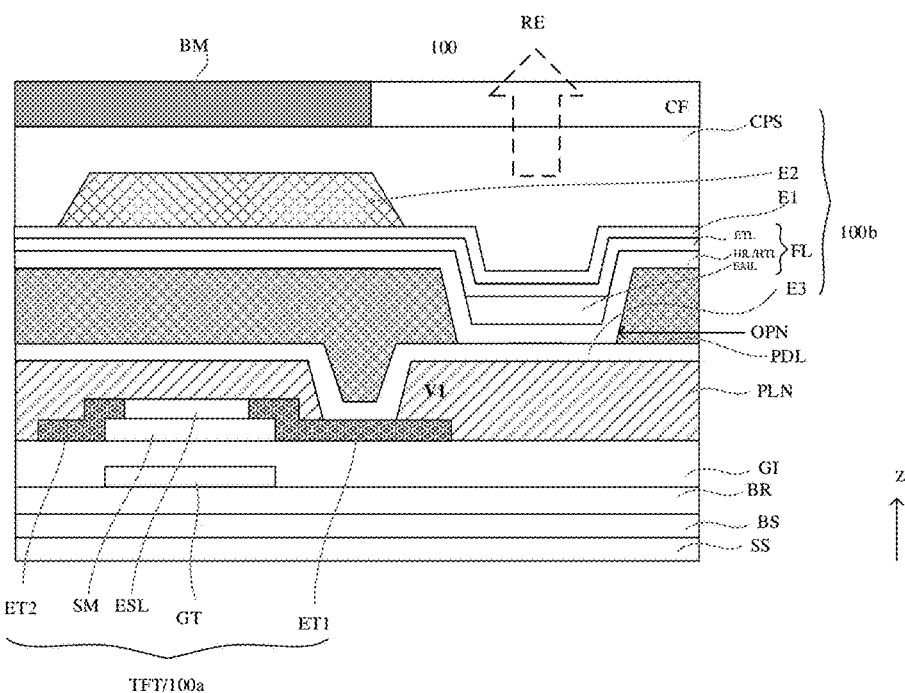
FIG. 3 is a cross-sectional view of a display panel provided by an embodiment of the present disclosure.

FIG. 1A is a schematic diagram of a pixel arrangement of a display panel. FIG. 1B is a schematic diagram of a pixel arrangement of a display panel. FIG. 2 is a schematic diagram of a sub-pixel in a display panel. FIG. 3 is a cross-sectional view of a display panel provided by an embodiment of the present disclosure.

As illustrated in FIG. 1A, FIG. 1B and FIG. 3, a display panel provided by at least one embodiment of the present disclosure includes a base substrate BS and a plurality of sub-pixels 100 located on the base substrate BS. As illustrated in FIG. 2, the sub-pixel 100 includes a pixel circuit 100a and a light-emitting element 100b, the light-emitting element 100b is connected to the pixel circuit 100a, and the pixel circuit 100a is configured to drive the light-emitting element 100b. For example, the pixel circuit 100a is configured to provide a driving current to drive the light-emitting element 100b to emit light.

For example, as illustrated in FIG. 1A and FIG. 1B, the plurality of sub-pixels 100 include a first sub-pixel 101, a second sub-pixel 102, and a third sub-pixel 103.

As illustrated in FIG. 1A and FIG. 1B, the display panel includes a plurality of pixel groups PG, and the pixel group PG includes at least three sub-pixels 100 among the plurality of sub-pixels 100.

As illustrated in FIG. 1A, the pixel group PG includes the first sub-pixel 101, the second sub-pixel 102, and the third sub-pixel 103. As illustrated in FIG. 1B, the pixel group PG includes the first sub-pixel 101, the second sub-pixel 102, the third sub-pixel 103, and a fourth sub-pixel 104. Some embodiments of the present disclosure take the case that first sub-pixel 101 is a red sub-pixel, the second sub-pixel 102 is a green sub-pixel, the third sub-pixel 103 is a blue sub-pixel, and the fourth sub-pixel 104 is a white sub-pixel as an example to describe, but the light-emitting colors of respective sub-pixels are not limited to this case, which can be determined according to requirements. The amount of sub-pixels included in the pixel group PG and the arrangement of the sub-pixels in the pixel group PG are not limited to the cases illustrated in FIG. 1A and FIG. 1B.

As illustrated in FIG. 3, the light-emitting element 100b includes a first electrode E1 and a second electrode E2, the second electrode E2 is electrically connected to the first electrode E1, and the first electrode E1 is closer to the base substrate BS than the second electrode E2.

In the display panel provided by the embodiments of the present disclosure, the second electrode E2 electrically connected to the first electrode E1 is provided to reduce the sheet resistance of the first electrode E1, reduce the IR-drop of the first electrode E1, improve the light extraction efficiency, and improve the display uniformity.

As illustrated in FIG. 3, the display panel further includes a third electrode E3 and a light-emitting functional layer FL, the light-emitting functional layer FL is located between the third electrode E3 and the first electrode E1, and the third electrode E3 is closer to the base substrate BS than the first electrode E1.

For example, in some embodiments of the present disclosure, the first electrode E1 is a cathode of the light-emitting element, and the third electrode E3 is an anode of the light-emitting element, which can form a top-emitting component. For example, in some other embodiments of the present disclosure, the first electrode E1 is an anode of the light-emitting element, and the third electrode E3 is a cathode of the light-emitting element. For example, in some embodiments of the present disclosure, the first electrode E1 and the third electrode E3 are transparent electrodes.

FIG. 3 illustrates a light-emitting region RE of the sub-pixel 100. As illustrated in FIG. 3, the display panel further includes a pixel defining layer PDL, the pixel defining layer PDL is provided with an opening OPN, and the opening OPN is configured to define the light-emitting region RE of the sub-pixel 100. For example, a portion of the third electrode E3 exposed by the opening OPN is the light-emitting region RE. For example, a region where the opening OPN of the pixel defining layer PDL is located is the light-emitting region RE.

As illustrated in FIG. 3, the light-emitting functional layer FL includes a hole injection layer HIL, a hole transport layer HTL, a light-emitting layer EML, and an electron transport layer ETL. The hole injection layer HIL and the hole transport layer HTL are illustrated as the same layer in FIG. 3, and the hole injection layer HIL is closer to the third electrode E3 than the hole transport layer HTL.

As illustrated in FIG. 3, the pixel circuit 100a includes a thin film transistor TFT, the thin film transistor TFT includes a gate electrode GT, a semiconductor layer SM, a source electrode ET2, and a drain electrode ET1, and the third electrode E3 is connected to the drain electrode ET1 through a via hole V1 penetrating a planarization layer PLN.

As illustrated in FIG. 3, the display panel further includes an etching stop layer ESL, and the etching stop layer ESL is located on the semiconductor layer SM and between the source electrode ET2 and the drain electrode ET1 to avoid affecting the performance of the semiconductor layer SM during an etching process for forming the source electrode ET2 and the drain electrode ET1.

Figure 4:
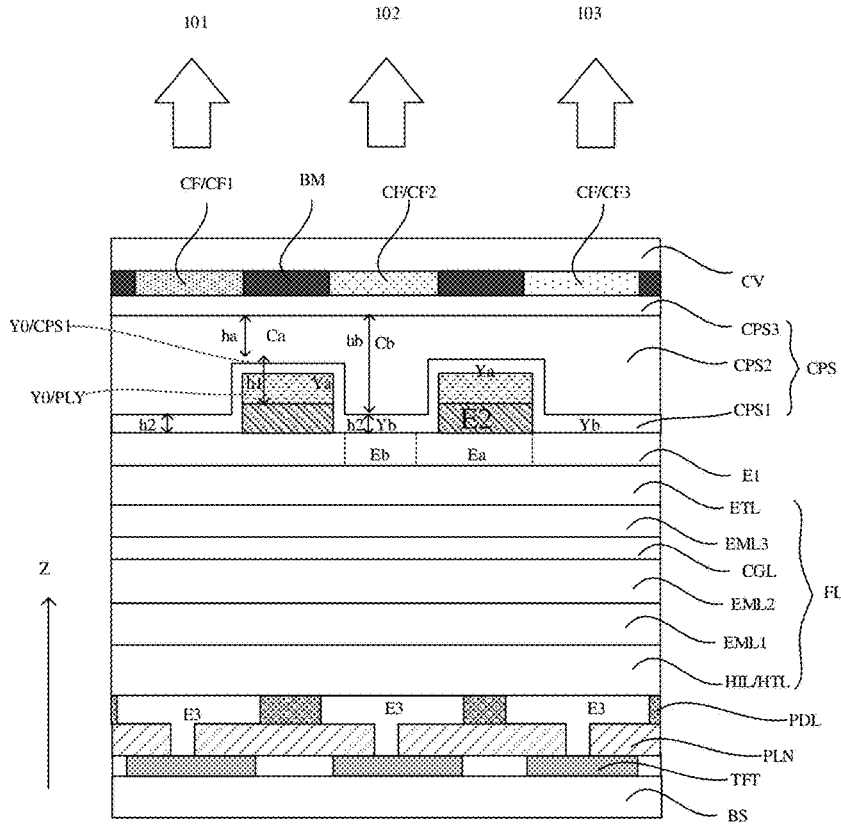
FIG. 4 is a cross-sectional view of a display panel provided by an embodiment of the present disclosure.
Figure 5:
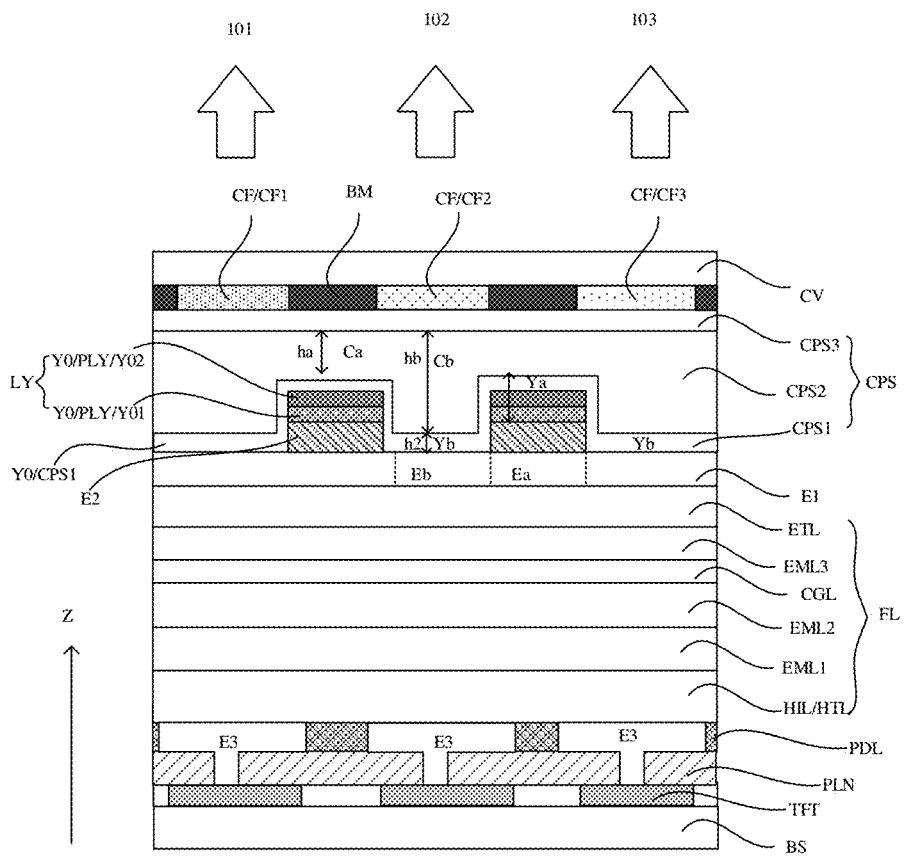
FIG. 5 is a cross-sectional view of a display panel provided by an embodiment of the present disclosure.
Figure 6:
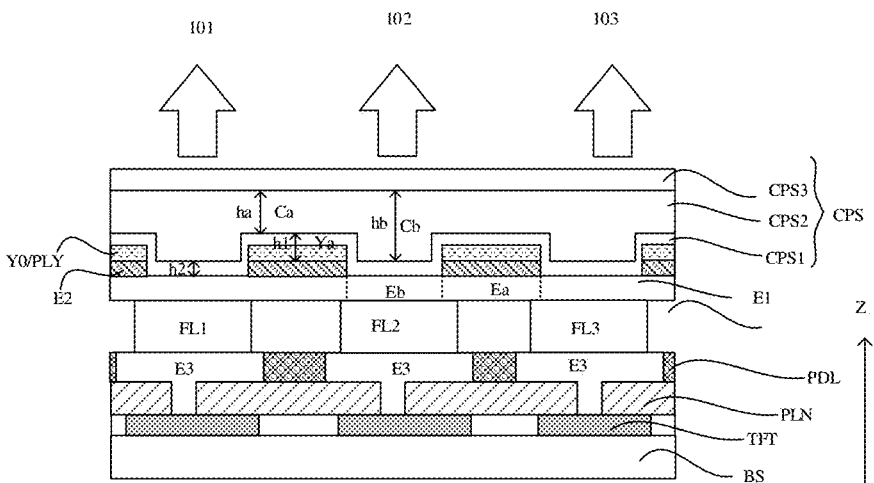
FIG. 6 is a cross-sectional view of a display panel provided by an embodiment of the present disclosure.
Figure 7:
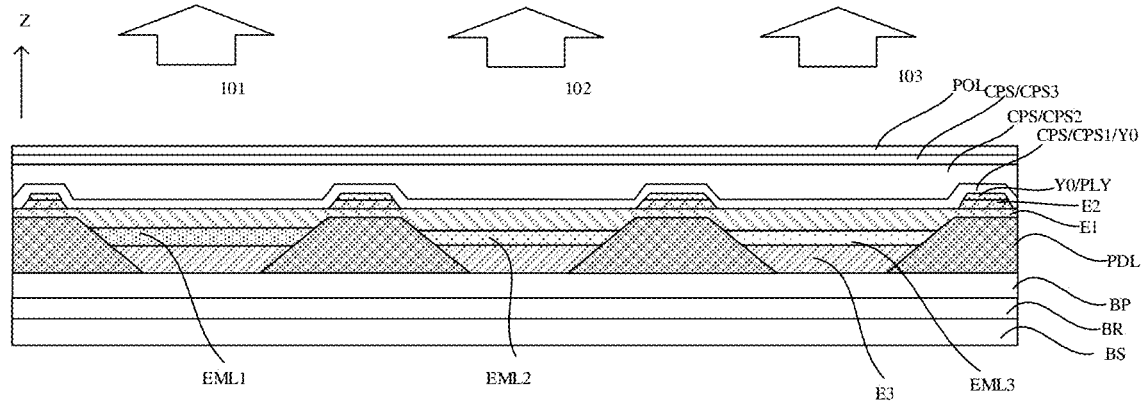
FIG. 7 is a cross-sectional view of a display panel provided by an embodiment of the present disclosure.

FIG. 4 is a cross-sectional view of a display panel provided by an embodiment of the present disclosure. FIG. 5 is a cross-sectional view of a display panel provided by an embodiment of the present disclosure. FIG. 6 is a cross-sectional view of a display panel provided by an embodiment of the present disclosure. FIG. 7 is a cross-sectional view of a display panel provided by an embodiment of the present disclosure.

For example, as illustrated in FIG. 4 to FIG. 6, the display panel further includes an inorganic layer Y0, and the inorganic layer Y0 is configured to protect the light-emitting element 100b to isolate water and oxygen and prevent water and oxygen from invading the light-emitting element 100b. The inorganic layer Y0 covers the first electrode E1 and the second electrode E2, the inorganic layer Y0 includes a first portion Ya and a second portion Yb, and the thickness h1 of the first portion Ya of the inorganic layer Y0 is different from the thickness h2 of the second portion Yb of the inorganic layer Y0.

In a traditional display panel, the thickness of the inorganic layer above the cathode is the same everywhere, but in the display panel provided by the embodiments of the present disclosure, the inorganic layer Y0 above the first electrode E1 and the second electrode E2 includes at least two portions with different thicknesses to facilitate the manufacturing of the second electrode E2 and facilitate the encapsulation of the light-emitting element.

For example, as illustrated in FIG. 4, the first portion Ya of the inorganic layer Y0 overlaps with the second electrode E2 in a direction perpendicular to the base substrate BS, the second portion Yb of the inorganic layer Y0 does not overlap with the second electrode E2 in the direction perpendicular to the substrate BS, and the thickness h1 of the first portion Ya of the inorganic layer Y0 is greater than the thickness of the second portion Yb of the inorganic layer Y0.

As illustrated in FIG. 4 to FIG. 6, the first electrode E1 includes a portion Ea overlapping with the second electrode E2 and a portion Eb not overlapping with the second electrode E2.

For example, as illustrated in FIG. 4, the inorganic layer Y0 includes a protective layer PLY, and the protective layer PLY is in contact with the second electrode E2. For example, as illustrated in FIG. 4, in some embodiments, the protective layer PLY is not in contact with the first electrode E1.

For example, as illustrated in FIG. 4, the inorganic layer Y0 further includes a first encapsulation thin film CPS1, the first encapsulation thin film CPS1 is in contact with the first electrode E1, the first encapsulation thin film CPS1 is in contact with the protective layer PLY, and the first encapsulation thin film CPS1 is in contact with the second electrode E2. For example, as illustrated in FIG. 4, the first encapsulation thin film CPS1 is in contact with a side surface of the second electrode E2. For example, as illustrated in FIG. 4, the first encapsulation thin film CPS1 is in contact with a top surface of the first electrode E1. For example, as illustrated in FIG. 4, the first encapsulation thin film CPS1 is in contact with both a top surface and a side surface of the protective layer PLY.

For example, the protective layer PLY is a patterned structure, the first encapsulation thin film CPS1 is a film layer, and the protective layer PLY and the first encapsulation thin film CPS1 are manufactured by different processes.

For example, the material of the protective layer PLY is different from the material of the first encapsulation thin film CPS1. For example, in some embodiments, the protective layer is made of silicon nitride, and the first encapsulation thin film CPS1 is made of silicon oxynitride.

For example, in some embodiments, the thickness of the first encapsulation thin film CPS1 is greater than the thickness of the protective layer PLY to play a better role in covering. For example, in some embodiments, the thickness of the first encapsulation thin film CPS1 is 3-5 times the thickness of the protective layer PLY. In some embodiments, the thickness of the protective layer PLY is about 2000 Å, and the thickness of the first encapsulation thin film CPS1 is about 8000 Å.

For example, as illustrated in FIG. 4, the pattern of the protection layer PLY and the pattern of the second electrode E2 are identical, and can be formed by the same patterning process. For example, as illustrated in FIG. 4, the orthographic projection of the protective layer PLY on the base substrate BS coincides with the orthographic projection of the second electrode E2 on the base substrate BS.

For example, as illustrated in FIG. 4 to FIG. 6, the display panel further includes a second encapsulation thin film CPS2, the second encapsulation thin film CPS2 is located on the first encapsulation thin film CPS1, and is in contact with the first encapsulation thin film CPS1. The material of the second encapsulation thin film CPS2 includes an organic material. The second encapsulation thin film CPS2 includes a first portion Ca and a second portion Cb, and the thickness of the first portion Ca of the second encapsulation thin film CPS2 is different from the thickness of the second portion Cb of the second encapsulation thin film CPS2. In the display panel provided by the embodiments of the present disclosure, because the inorganic layer Y0 includes two portions with different thicknesses, in order to facilitate obtaining a flat surface, the second encapsulation thin film CPS2 also includes two portions with different thicknesses.

For example, the first portion Ca of the second encapsulation thin film CPS2 is in contact with the first portion Ya of the inorganic layer Y0, the second portion Cb of the second encapsulation thin film CPS2 is in contact with the second portion Yb of the inorganic layer Y0, and the thickness of the first portion Ca of the second encapsulation thin film CPS2 is smaller than the thickness of the second portion Yb of the second encapsulation thin film CPS2 to facilitate the second encapsulation thin film CPS2 to obtain a substantially flat upper surface, which is beneficial to the encapsulation of the display panel.

For example, as illustrated in FIG. 4 to FIG. 6, the display panel further includes a third encapsulation thin film CPS3, and the third encapsulation thin film CPS3 is located on the second encapsulation thin film CPS2. For example, in some embodiments, the thickness of the third encapsulation thin film CPS3 is smaller than the thickness of the first encapsulation thin film CPS1. In order to facilitate the first encapsulation thin film CPS1 to cover the protective layer PLY, the thickness of the first encapsulation thin film CPS1 can be set slightly greater.

For example, as illustrated in FIG. 4 to FIG. 7, the thickness of the second encapsulation thin film CPS2 is greater than the thickness of the first encapsulation thin film CPS1, and the thickness of the second encapsulation thin film CPS2 is greater than the thickness of the third encapsulation thin film CPS3. For example, in some embodiments, the thickness of the first encapsulation thin film CPS1 ranges from 5000 Å to 10000 Å, the thickness of the second encapsulation thin film CPS2 ranges from 4 $\mu$m to 16 $\mu$m, and the thickness of the third encapsulation thin film CPS3 ranges from 5000 Å to 10000 Å.

For example, as illustrated in FIG. 4 to FIG. 6, the first encapsulation thin film CPS1, the second encapsulation thin film CPS2, and the third encapsulation thin film CPS3 constitute an encapsulation layer CPS, the first encapsulation thin film CPS1, the second encapsulation thin film CPS2, and the third encapsulation thin film CPS3 are arranged sequentially, and the first encapsulation thin film CPS1 is closer to the base substrate BS than the third encapsulation thin film CPS3.

For example, as illustrated in FIG. 4 to FIG. 6, the encapsulation layer CPS is configured to encapsulate a plurality of light-emitting elements 100b, and the encapsulation layer CPS covers the protective layer PLY and covers the second electrode E2. For example, as illustrated in FIG. 4 to FIG. 6, the encapsulation layer CPS is in contact with the protective layer PLY.

For example, materials of the protective layer PLY and the first encapsulation thin film CPS1 include an inorganic insulating material. The inorganic layer LY0 may also be referred to as an inorganic non-metal layer, an inorganic insulating layer, or an inorganic insulating material layer. For example, the material of the third encapsulation thin film CPS3 includes an inorganic material. For example, the inorganic insulating material includes at least one selected from a group consisting of: silicon oxide, silicon nitride, and silicon oxynitride.

For example, the protective layer PLY may also be regarded as a portion of the encapsulation layer CPS. That is, the encapsulation layer CPS includes the protective layer PLY, the first encapsulation thin film CPS1, the second encapsulation thin film CPS2, and the third encapsulation thin film CPS3.

For example, the protective layer PLY, the first encapsulation thin film CPS1, and the third encapsulation thin film CPS3 can be formed by a chemical vapor deposition (CVD) process. For example, the second encapsulation thin film CPS2 is formed by an inkjet printing process (IJP).

For example, as illustrated in FIG. 4 to FIG. 6, the third electrode E3 is a pixel electrode, the first electrode E1 is a common electrode, and the plurality of sub-pixels share the same first electrode E1. The third electrodes E3 of different sub-pixels are independent from each other. The third electrodes E3 of different sub-pixels are separated from each other and can be input with signals respectively.

For example, in order to protect the light-emitting element, the orthographic projection of the encapsulation layer CPS on the base substrate BS covers the orthographic projection of the light-emitting functional layer FL on the base substrate BS.

For example, as illustrated in FIG. 4 to FIG. 5, the light-emitting functional layer FL includes a hole injection layer HIL, a hole transport layer HTL, a first light-emitting layer EML1, a second light-emitting layer EML2, a third light-emitting layer EML3, and an electron transport layer ETL, the first light-emitting layer EML1 is configured to emit light of a first color, the second light-emitting layer EML2 is configured to emit light of a second color, and the third light-emitting layer EML3 is configured to emit light of a third color. For example, the light of the first color includes a green light, the light of the second color includes a red light, and the light of the third color includes a blue light.

For example, as illustrated in FIG. 4 to FIG. 5, the light-emitting functional layer FL further includes a charge generating layer CGL, and the hole injection layer HIL, the hole transport layer HTL, the second light-emitting layer EML2, the first light-emitting layer EML1, the charge generating layer CGL, the third light-emitting layer EML3, and the electron transport layer ETL are sequentially stacked.

For example, as illustrated in FIG. 4 to FIG. 5, the light-emitting functional layer FL further includes a charge generating layer CGL, and the hole injection layer HIL, the second light-emitting layer EML2, the hole transport layer HTL, the first light-emitting layer EML1, the charge generating layer CGL, the third light-emitting layer EML3, and the electron transport layer ETL are sequentially stacked.

For example, as illustrated in FIG. 4 to FIG. 5, the third light-emitting layer EML3 is provided at a side of the charge generating layer CGL, and the first light-emitting layer EML1 and the second light-emitting layer EML2 are provided at a side of the charge generating layer CGL opposite to a side of the charge generating layer CGL where the third light-emitting layer EML3 is provided. For example, as illustrated in FIG. 4 to FIG. 5, the third light-emitting layer EML3 is provided at a side of the charge generating layer CGL facing away from the base substrate BS, and the first light-emitting layer EML1 and the second light-emitting layer EML2 are provided at a side of the charge generating layer CGL close to the base substrate BS.

For example, in another embodiment, the first light-emitting layer EML1, the second light-emitting layer EML2, and the third light-emitting layer EML3 are not stacked. As illustrated in FIG. 7, the first light-emitting layer EML1, the second light-emitting layer EML2, and the third light-emitting layers EML3 are all in contact with the hole transport layer HTL.

FIG. 4 and FIG. 5 are illustrated by taking a case of using an open mask to manufacture each film layer of the light-emitting functional layer FL as an example, and the embodiments of the present disclosure include but are not limited thereto. In other embodiments, a fine metal mask can be used to manufacture the light-emitting layer in the light-emitting functional layer FL of the sub-pixel, while other film layers in the light-emitting functional layer FL are manufactured by using an open mask. For example, FIG. 7 is the case where a fine metal mask is used to manufacture the light-emitting layer.

FIG. 7 further illustrates a polarizer POL. The function of providing the polarizer POL is to reduce the reflection of external light and improve the contrast. The display panel illustrated in FIG. 7 may not be provided with a black matrix and a color filter layer, and does not need to perform a cell-assembling process, and it is sufficient to form a polarizer POL on the encapsulation layer CPS.

For example, as illustrated in FIG. 5, the protective layer PLY includes a first protective sub-layer Y01 and a second protective sub-layer Y02. The protective layer PLY may be a single layer or include a plurality of protective sub-layers. FIG. 5 is illustrated by taking the case that the protective layer PLY includes two protective sub-layers as an example.

As illustrated in FIG. 4 to FIG. 5, the display panel further includes a color filter layer CF and a cover plate CV. The color filter layer CF includes a first color filter portion CF1, a second color filter portion CF2, and a third color filter portion CF3. The first color filter portion CF1 can emit or transmit the light of the first color, the second color filter portion CF2 can emit or transmit the light of the second color, and the third color filter portion CF3 can emit or transmit the light of the third color. The light of the first color, the light of the second color, and the light of the third color are all a monochromatic light. In the case where the fourth sub-pixel is a white sub-pixel, a portion of the color filter layer CF corresponding to the light-emitting region of the fourth sub-pixel can be provided with a transparent layer to emit white light. For example, the color filter layer CF can be formed on the cover plate CV.

FIG. 4 to FIG. 6 do not illustrate the entire structure of the pixel circuit 100a, and the pixel circuit 100a is represented by a thin film transistor TFT. The pixel circuit 100a includes a thin film transistor TFT and a storage capacitor. For example, the pixel circuit of the display panel includes a 7T2C structure, a 6T1C structure, a 6T2C structure or a 9T2C structure, and may also be a structure adopting other amount of transistors or other amount of storage capacitors. FIG. 3 illustrates a support substrate SS. For example, the support substrate SS is a glass substrate, but is not limited thereto. The support substrate SS plays a role of supporting during the manufacturing process of the display panel, and the support substrate SS may not be available in the final product.

For example, as illustrated in FIG. 4 to FIG. 7, the second electrode E2 is in contact with the first electrode E1. For example, the resistivity of the second electrode E2 is smaller than the resistivity of the first electrode E1. The conductivity of the second electrode E2 is greater than the conductivity of the first electrode E1, so that the resistivity of the first electrode E1 decreases and the electron injection efficiency is improved. For example, the material of the second electrode E2 includes metal. For example, the first electrode E1 is made of a transparent or translucent conductive material. For example, the material of the first electrode E1 includes a conductive metal oxide. For example, the metal includes at least one selected from a group consisting of: aluminum, silver, molybdenum, titanium, copper, gold, and magnesium, and the conductive metal oxide includes at least one selected from a group consisting of: indium zinc oxide (IZO), indium gallium zinc oxide (IGZO), indium tin oxide (ITO), fluorine-doped tin oxide (FTO, $SnO_2$:F), zinc oxide (ZnO), zinc aluminum oxide (AZO), tin zinc oxide ($Zn_2SnO_4$), tin indium oxide ($In_4Sn_3O_{12}$), magnesium indium oxide ($MgIn_2O_4$), cadmium indium oxide ($CdIn_2O_4$). For example, amorphous IZO has high transmittance, which improves the light extraction efficiency of the top-emitting component. The material of the first electrode E1 and the material of the second electrode E2 are not limited to the above description.

It should be noted that, in some other embodiments, the resistivity of the second electrode E2 may be not less than the resistivity of the first electrode E1. For example, in order to improve the transmittance, the second electrode E2 is not made of metal, but made of a conductive metal oxide. For example, the selection range of the metal oxide in the second electrode E2 is identical to the selection range of the metal oxide in the above-mentioned first electrode E1. That is, the material of the second electrode E2 includes at least one selected from a group consisting of: indium zinc oxide (IZO), indium gallium zinc oxide (IGZO), indium tin oxide (ITO), fluorine-doped tin oxide (FTO, $SnO_2$:F), zinc oxide (ZnO), zinc aluminum oxide (AZO), tin zinc oxide ($Zn_2SnO_4$), tin indium oxide ($In_4Sn_3O_{12}$), magnesium indium oxide ($MgIn_2O_4$), cadmium indium oxide ($CdIn_2O_4$). The second electrode E2 is connected in parallel with the first electrode E1, which can reduce the resistance and reduce the IR-drop. For example, in some embodiments, the second electrode E2 and the first electrode E1 are made of the same metal oxide, and in other embodiments, the second electrode E2 and the first electrode E1 are made of different metal oxides.

For example, the third electrode E3 is made of a transparent conductive material and a metal material. For example, the material of the third electrode E3 includes at least one of transparent conductive metal oxide and silver. For example, the selection range of the transparent conductive metal oxide in the third electrode E3 is identical to the selection range of the metal oxide of the first electrode E1. That is, the transparent conductive metal oxide in the third electrode E3 includes at least one selected from a group consisting of: indium zinc oxide (IZO), indium gallium zinc oxide (IGZO), indium tin oxide (ITO), fluorine-doped tin oxide (FTO, $SnO_2$:F), zinc oxide (ZnO), zinc aluminum oxide (AZO), tin zinc oxide ($Zn_2SnO_4$), tin indium oxide ($In_4Sn_3O_{12}$), magnesium indium oxide ($MgIn_2O_4$), cadmium indium oxide ($CdIn_2O_4$). For example, the third electrode E3 may adopt a structure in which three sub-layers of ITO-Ag-ITO are stacked.

For example, in some embodiments, as illustrated in FIG. 4 to FIG. 7, the second electrode E2 is only located above the pixel defining layer (PDL), without reducing the pixel aperture ratio. For example, in some embodiments, as illustrated in FIG. 7, in order to maximize the aperture ratio, the orthographic projection of the second electrode E2 on the base substrate does not overlap with the orthographic projection of the opening OPN of the pixel defining layer (PDL) on the base substrate. For example, in some embodiments, as illustrated in FIG. 7, in order to maximize the aperture ratio, the orthographic projection of the second electrode E2 on the base substrate completely falls within the orthographic projection of the pixel defining layer (PDL) on the base substrate.

For example, in some embodiments, as illustrated in FIG. 3 to FIG. 7, the display panel further includes a black matrix BM. The black matrix BM is configured to separate the color filter portions of the color filter layer. For example, as illustrated in FIG. 4 and FIG. 5, the black matrix BM can be formed on the cover plate CV. Providing of the black matrix BM can reduce the reflection of external light, which is beneficial to improving the contrast of the display image and improving the display effect. For example, the orthographic projection of the black matrix BM on the base substrate BS overlaps with the orthographic projection of the second electrode E2 on the base substrate BS. For example, the orthographic projection of the black matrix BM on the base substrate BS covers the orthographic projection of the second electrode E2 on the base substrate BS. For example, the orthographic projection of the black matrix BM on the base substrate BS is larger than or equal to the orthographic projection of the second electrode E2 on the base substrate BS. For example, in some embodiments, the orthographic projection of the black matrix BM on the base substrate BS coincides with the orthographic projection of the second electrode E2 on the base substrate BS. Because the protective layer PLY and the second electrode E2 can be formed by the same patterning process, in some embodiments, the orthographic projection of the black matrix BM on the base substrate BS overlaps with the orthographic projection of the protective layer PLY on the base substrate BS. In some embodiments, the orthographic projection of the black matrix BM on the base substrate BS covers the orthographic projection of the protective layer PLY on the base substrate BS. For example, the orthographic projection of the black matrix BM on the base substrate BS is larger than or equal to the orthographic projection of the protective layer PLY on the base substrate BS. For further example, in some embodiments, the orthographic projection of the black matrix BM on the base substrate BS coincides with the orthographic projection of the protective layer PLY on the base substrate BS.

For example, in some embodiments, as illustrated in FIG. 3 to FIG. 7, the orthographic projection of the second electrode E2 on the base substrate BS at least partially overlaps with the orthographic projection of the black matrix BM on the base substrate.

Figure 8:
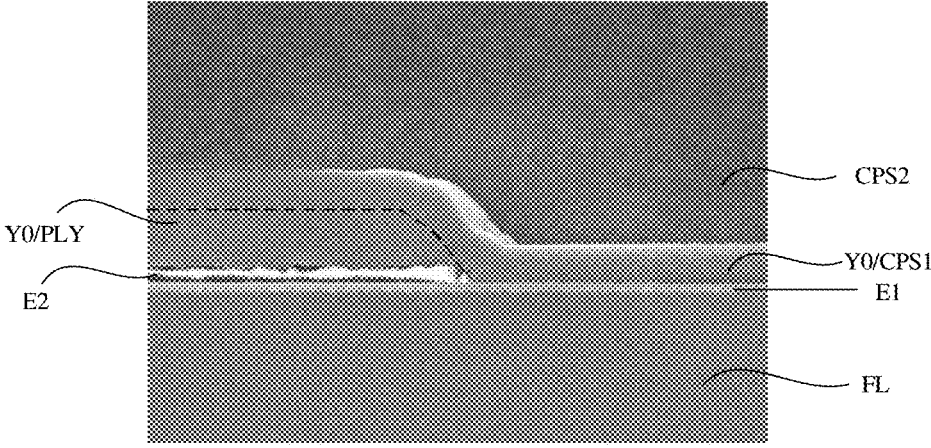
FIG. 8 is a scanning electron microscope of a display panel provided by an embodiment of the present disclosure.

FIG. 8 is a scanning electron microscope of a display panel provided by an embodiment of the present disclosure. As illustrated in FIG. 8, the inorganic layer Y0 includes the protective layer PLY and the first encapsulation thin film CPS1. The thickness of the first encapsulation thin film CPS1 is substantially the same everywhere, so that the inorganic layer Y0 includes two portions with different thicknesses: the first portion Ya and the second portion Yb, and the thickness h1 of the first portion Ya (at a position of the inorganic layer Y0 including the protective layer PLY) of the inorganic layer Y0 is greater than the thickness of the second portion Yb (at a position of the inorganic layer Y0 not including the protective layer PLY) of the inorganic layer Y0. For the display panel illustrated in FIG. 8, in some embodiments, there may be no obvious boundary between the protective layer PLY and the first encapsulation thin film CPS1 of the display panel, and FIG. 8 roughly depicts the interface between the protective layer PLY and the first encapsulation thin film CPS1.

In the embodiments of the present disclosure, the thickness of an element refers to the dimension of the element in the direction perpendicular to the base substrate BS.

Figure 9A:
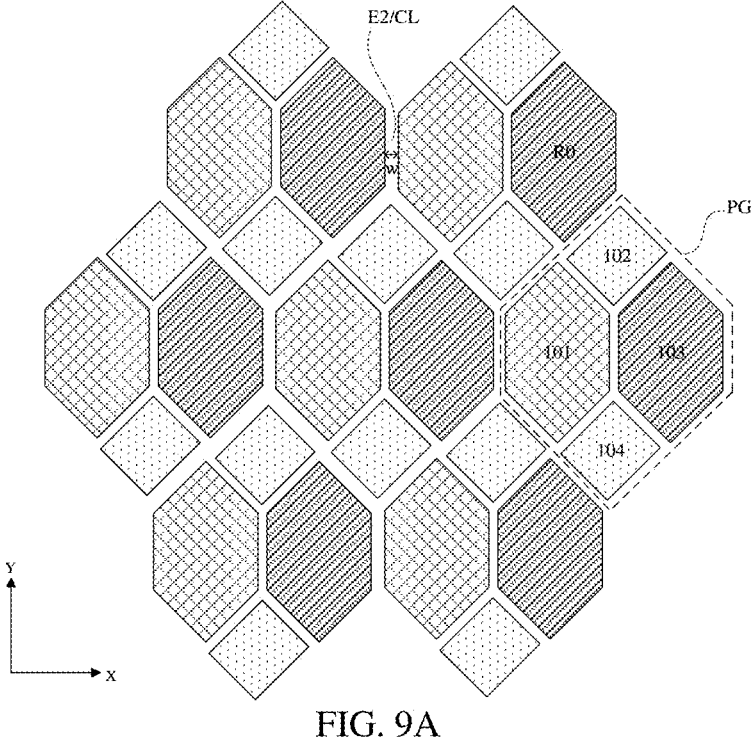
FIG. 9A is a schematic diagram of a pixel arrangement and a second electrode of a display panel provided by an embodiment of the present disclosure.
Figure 9B:
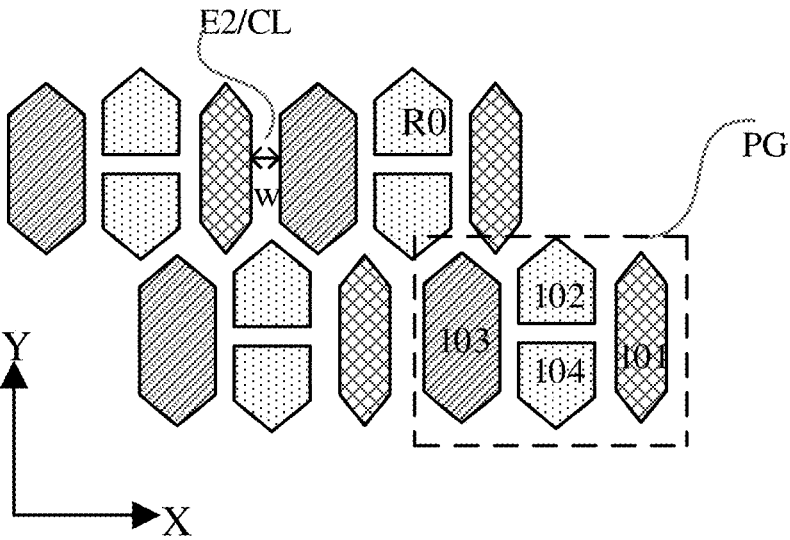
FIG. 9B is a schematic diagram of a pixel arrangement and a second electrode of a display panel provided by an embodiment of the present disclosure.
Figure 10:
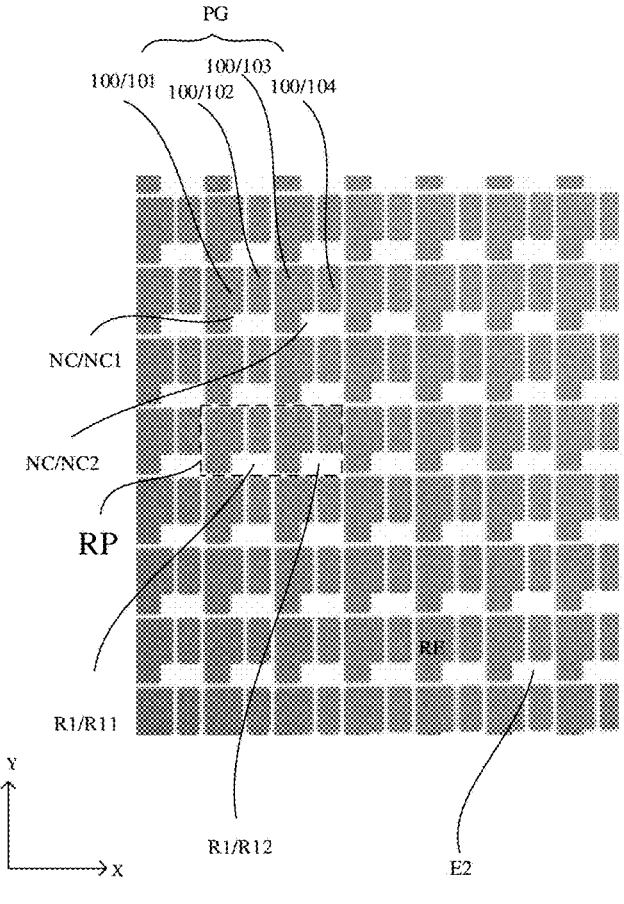
FIG. 10 is a schematic diagram of a pixel arrangement and a second electrode of a display panel provided by an embodiment of the present disclosure.
Figure 11A:
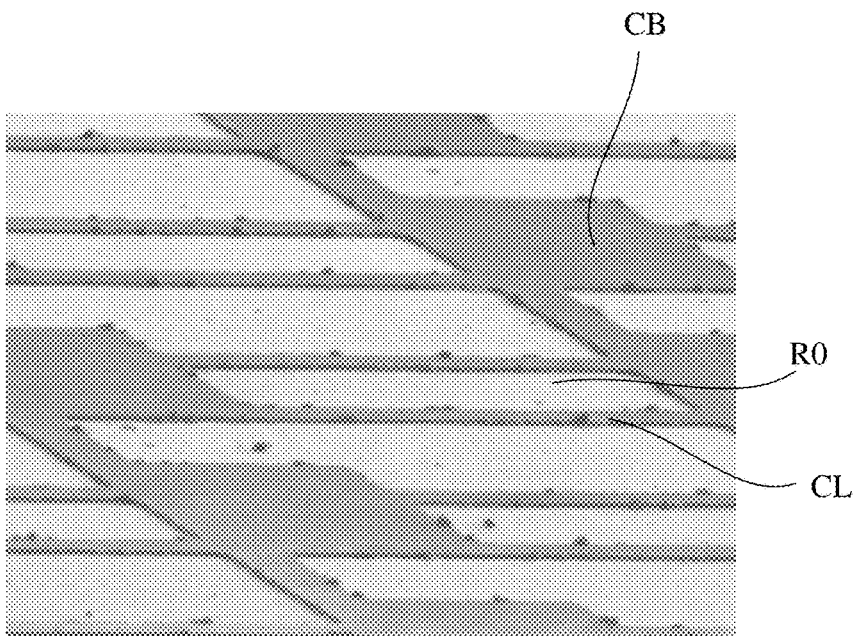
FIG. 11A is a scanning electron microscope of a second electrode in a display panel provided by an embodiment of the present disclosure.
Figure 11B:
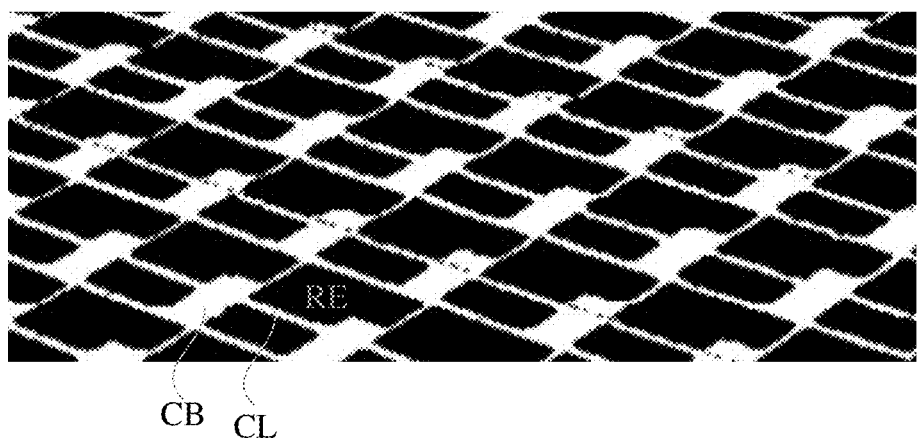
FIG. 11B is a schematic diagram of another viewing angle of a second electrode in a display panel provided by an embodiment of the present disclosure.
Figure 12:
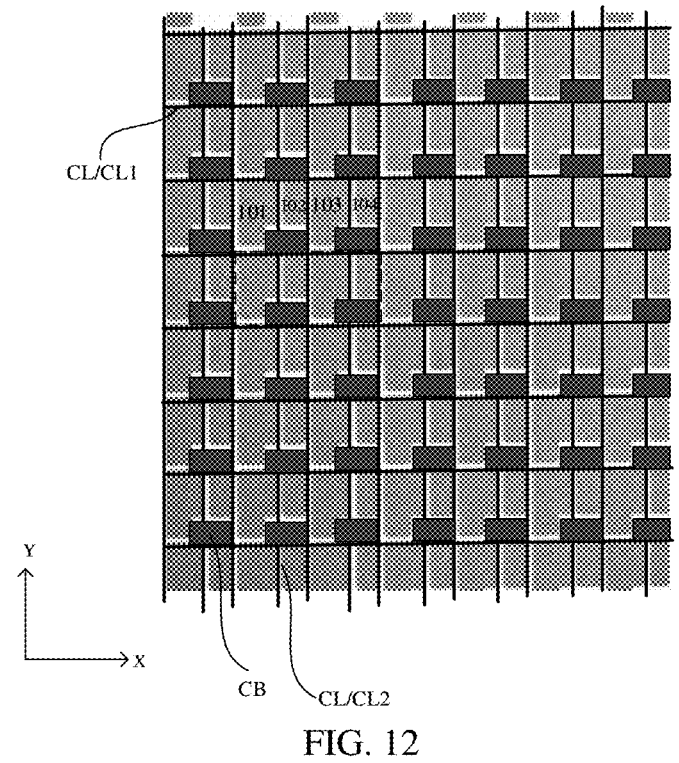
FIG. 12 is a schematic diagram of a pixel arrangement and a second electrode of a display panel provided by an embodiment of the present disclosure.

FIG. 9A is a schematic diagram of a pixel arrangement and a second electrode of a display panel provided by an embodiment of the present disclosure. FIG. 9B is a schematic diagram of a pixel arrangement and a second electrode of a display panel provided by an embodiment of the present disclosure. FIG. 10 is a schematic diagram of a pixel arrangement and a second electrode of a display panel provided by an embodiment of the present disclosure. FIG. 11A is a scanning electron microscope of a second electrode in a display panel provided by an embodiment of the present disclosure. FIG. 11B is a schematic diagram of another viewing angle of the second electrode in the display panel provided by an embodiment of the present disclosure. FIG. 12 is a schematic diagram of a pixel arrangement and a second electrode of a display panel provided by an embodiment of the present disclosure. The portion between the light-emitting regions of respective sub-pixels in FIG. 9A and FIG. 9B (the white region between the light-emitting regions of respective sub-pixels) refers to the second electrode E2. The light-emitting region of each sub-pixel in FIG. 9A and FIG. 9B corresponds to the opening region R0 of the second electrode. The white region between adjacent sub-pixels in FIG. 10 refers to the second electrode E2. The gray region in FIG. 10 refers to the light-emitting region RE of the sub-pixel. The white region between adjacent sub-pixels in FIG. 11B r refers to the second electrode E2. The black region in FIG. 11B refers to the light-emitting region RE of the sub-pixel.

For example, FIG. 9A and FIG. 9B are illustrated by taking the case that the first sub-pixel 101 is a red sub-pixel, the second sub-pixel 102 is a green sub-pixel, the third sub-pixel 103 is a blue sub-pixel, and the fourth sub-pixel 104 is a green sub-pixel as an example. FIG. 10 and FIG. 12 are illustrated by taking the case that the first sub-pixel 101 is a red sub-pixel, the second sub-pixel 102 is a green sub-pixel, the third sub-pixel 103 is a blue sub-pixel, and the fourth sub-pixel 104 is a white sub-pixel as an example.

For example, as illustrated in FIG. 9A, FIG. 9B, and FIG. 11A to FIG. 12, the second electrode E2 includes a plurality of conductive lines CL and opening regions R0 surrounded by the plurality of conductive lines CL, the light-emitting element 100b includes a light-emitting region RE, and the orthographic projection of the light-emitting region RE on the base substrate BS overlaps with the orthographic projection of the opening region R0 on the base substrate BS.

For example, in order to obtain a better effect of reducing the IR-drop and a higher aperture ratio, the line width of the conductive line CL is of a micron level. For example, the line width of the conductive line CL ranges from 5 μm to 50 μm. For example, in some embodiments, the line width of the conductive line CL ranges from 12 μm to 20 μm. The line width of the conductive line CL is a width of the conductive line CL in a direction perpendicular to the extending direction of the conductive line CL. FIG. 9A and FIG. 9B illustrate the line width W of the conductive line CL.

The second electrode E2 in the display panel provided by the embodiments of the present disclosure can be formed into a mesh structure, which can greatly reduce the sheet resistance of the mesh by more than 80%, and can solve the problem of conflict between IR-drop and transmittance.

For example, in some embodiments, in order to obtain a better effect of reducing the IR-drop and a higher aperture ratio, and taking into account process errors, a ratio of an overlapping area of the orthographic projection of the second electrode E2 on the base substrate BS and the orthographic projection of the light-emitting region RE on the base substrate BS to an area of the orthographic projection of the light-emitting region RE on the base substrate BS is less than 10%. In the embodiment illustrated in FIG. 12 of the present disclosure, it is strived that the orthographic projection of the second electrode E2 on the base substrate BS does not overlap with the orthographic projection of the light-emitting region RE on the base substrate BS, and in some embodiments, this goal can also be achieved. FIG. 9A to FIG. 12 are illustrated by taking the case that the orthographic projection of the second electrode E2 on the base substrate BS does not overlap with the orthographic projection of the light-emitting region RE on the base substrate BS as an example.

For example, as illustrated in FIG. 11A to FIG. 12, the second electrode E2 further includes a plurality of conductive blocks CB, and the plurality of conductive blocks CB are electrically connected to a plurality of conductive lines CL. The plurality of conductive lines CL include a first conductive line CL1 extending in a first direction X and a second conductive line CL2 extending in a second direction Y, the dimension of the conductive block CB in the first direction X is larger than the dimension of the second conductive line CL2 in the first direction X, the dimension of the conductive block CB in the second direction Y is larger than the dimension of the first conductive line CL1 in the second direction Y, and the first direction X intersects with the second direction Y. For example, the conductive block CB and the conductive line CL are located in the same layer and formed by the same patterning process, and the conductive block CB and the conductive line CL are formed integrally.

For example, as illustrated in FIG. 12, the dimension of the conductive block CB in the first direction X ranges from 40 μm to 60 μm, and the dimension of the conductive block CB in the second direction Y ranges from 20 μm to 40 μm. For example, the dimension of the conductive block CB in the first direction X is the length of the conductive block CB, and the dimension of the conductive block CB in the second direction Y is the width of the conductive block CB. For example, the dimension of the conductive block CB in the first direction X is 50 μm, and the dimension of the conductive block CB in the second direction Y is 20 μm.

It should be noted that the second electrode E2 may not include the conductive block CB, but only include the conductive line CL. The extending direction of the mesh-shaped conductive line CL is not limited to extending in the first direction X or the second direction Y, and may also extend in other directions. For example, the position of a conductive line may be determined according to the position of light-emitting regions of sub-pixels that are adjacent to each other.

For example, in some embodiments of the present disclosure, the first direction X and the second direction Y are directions parallel to the main surface of the base substrate, and a third direction Z is a direction perpendicular to the main surface of the base substrate. The main surface of the base substrate is a surface on which various elements are manufactured. The upper surface of the base substrate in FIG. 4 is the main surface of the base substrate. For example, the first direction X intersects with the second direction Y. For further example, the first direction X is perpendicular to the second direction Y. For example, the first direction X is the row direction, and the second direction Y is the column direction, but is not limited thereto.

For example, as illustrated in FIG. 12, the conductive block CB is located at an intersection position of the first conductive line CL1 and the second conductive line CL2.

For example, as illustrated in FIG. 10, the display panel further includes a plurality of pixel regions RP, the plurality of pixel regions RP are arranged in an array, each pixel region RP includes a pixel group PG and a reserved region R1, the pixel group PG includes at least three sub-pixels 100 among the plurality of sub-pixels 100, and the conductive block CB corresponds to the reserved region R1. For example, the shape of the reserved region R1 includes a rectangle, but is not limited thereto.

For example, as illustrated in FIG. 10, the plurality of sub-pixels 100 include a first sub-pixel 101, a second sub-pixel 102, and a third sub-pixel 103, and the pixel group PG includes the first sub-pixel 101, the second sub-pixel 102, and the third sub-pixel 103.

For example, as illustrated in FIG. 10, the first sub-pixel 101, the second sub-pixel 102, and the third sub-pixel 103 are arranged sequentially, the area of the light-emitting region RE of the second sub-pixel 102 is smaller than the area of the light-emitting region RE of the first sub-pixel 101, the light-emitting region RE of the first sub-pixel 101 is provided with a first notch NC1, and the first notch NC1 is close to the light-emitting region RE of the second sub-pixel 102.

For example, as illustrated in FIG. 10, the reserved region R1 includes a first reserved region R11, and the first reserved region R11 is located at a side of the light-emitting region RE of the second sub-pixel 102 and occupies the position of the first notch NC1.

For example, as illustrated in FIG. 10, in order to achieve a balance between a high aperture ratio and a better reduction of the resistance of the first electrode to improve the display effect, the area of the first reserved region R11 is greater than one third of the area of the light-emitting region RE of the second sub-pixel 102 and smaller than or equal to the area of the light-emitting region RE of the first sub-pixel 101. For example, in some embodiments, the area of the first reserved region R11 is smaller than or equal to the area of the light-emitting region RE of the second sub-pixel 102.

For example, as illustrated in FIG. 10, the plurality of sub-pixels 100 further include a fourth sub-pixel 104, the fourth sub-pixel 104 and the second sub-pixel 102 are arranged at both sides of the third sub-pixel 103, respectively, and the area of the light-emitting region RE of the fourth sub-pixel 104 is smaller than the area of the light-emitting region RE of the third sub-pixel 103.

For example, as illustrated in FIG. 10, the light-emitting region RE of the third sub-pixel 103 is provided with a second notch NC2, and the second notch NC2 is close to the light-emitting region RE of the fourth sub-pixel 104.

For example, as illustrated in FIG. 10, the reserved region R1 includes a second reserved region R12, and the second reserved region R12 is located at a side of the light-emitting region RE of the fourth sub-pixel 104 and occupies the position of the second notch NC2.

For example, in order to achieve a balance between a high aperture ratio and a better reduction of the IR-drop of the first electrode to improve the display effect, the area of the second reserved region R12 is greater than one third of the area of the light-emitting region RE of the fourth sub-pixel 104 and smaller than or equal to the area of the light-emitting region RE of the third sub-pixel 103. For example, in some embodiments, the area of the second reserved region R12 is smaller than or equal to the area of the light-emitting region RE of the fourth sub-pixel 104.

In a traditional display panel, if no reserved region is provided, the shape of the light-emitting region RE can be provided as a regular pattern, for example, a rectangle. In the embodiments of the present disclosure, in order to better reduce the IR-drop of the first electrode E1, the regular pattern such as a rectangular light-emitting region RE is adjusted to reduce the area of the light-emitting region RE and form a notch.

For example, in some embodiments, the area of the light-emitting region RE of the first sub-pixel 101 is equal to the area of the light-emitting region RE of the third sub-pixel 103, and the area of the light-emitting region RE of the second sub-pixel 102 is equal to the area of the light-emitting region RE of the fourth sub-pixel 104, but not limited thereto, and the area of the light-emitting region of each sub-pixel can be determined according to requirements.

For example, the display panel further includes a color filter layer CF, and the color filter layer CF is located on the encapsulation layer CPS. The color filter layer CF is located on the third encapsulation thin film CPS3.

At least one embodiment of the present disclosure further provides a method for manufacturing a display panel, as illustrated in FIG. 3 to FIG. 7, including forming a plurality of sub-pixels 100 on a base substrate BS. For example, forming the sub-pixel 100 includes forming a pixel circuit 100a and forming a light-emitting element 100b, the light-emitting element 100b is connected to the pixel circuit 100a, and the pixel circuit 100a is configured to drive the light-emitting element 100b. For example, forming the light-emitting element 100b includes: forming a first electrode E1; and forming a second electrode E2, in which the second electrode E2 is connected to the first electrode E1, and the first electrode E1 is closer to the base substrate BS than the second electrode E2.

FIG. 13A to FIG. 13E are schematic diagrams of forming the second electrode and the first encapsulation thin film in a method for manufacturing a display panel provided by an embodiment of the present disclosure. For example, forming the second electrode E2 includes the following steps.

Figure 13A:
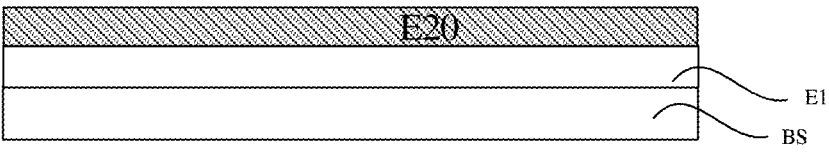
FIG. 13A to FIG. 13E are schematic diagrams of forming a second electrode and a first encapsulation thin film in a method for manufacturing a display panel provided by an embodiment of the present disclosure.

Step S1, as illustrated in FIG. 13A, forming an electrode thin film E20 on the first electrode E1.

Figure 13B:
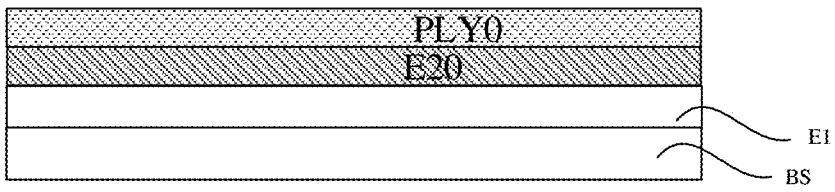

Step S2, as illustrated in FIG. 13B, forming a protective thin film PLY0 on the electrode thin film E20.

Figure 13C:
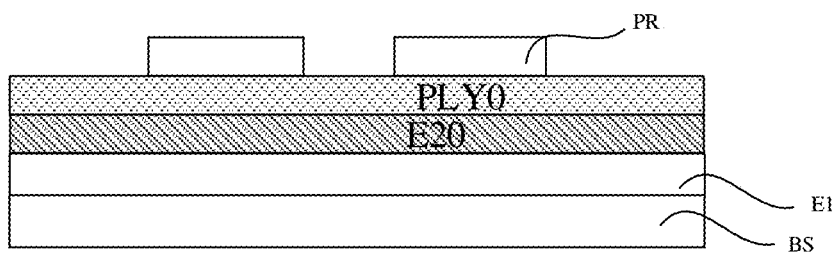

Step S3, as illustrated in FIG. 13C, forming a photoresist pattern PR on the protective thin film.

Figure 13D:
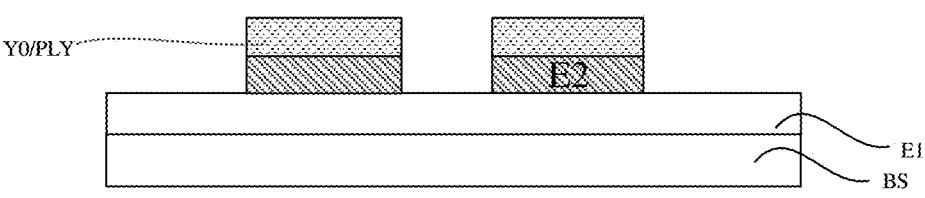

Step S4, as illustrated in FIG. 13D, using the photoresist pattern PR as a mask and using the first electrode E1 as an etching stop layer, and patterning the protective thin film PLY0 and the electrode thin film E20 by using the same patterning process to form a protective layer PLY and form the second electrode E2.

For example, the protective thin film PLY0 is configured to protect the electrode thin film E20 to prevent the electrode thin film E20 from being oxidized when the display substrate is taken out from a vacuum chamber for a subsequent patterning process.

For example, when forming the first electrode E1 and the second electrode E2, a vacuum chamber is used for continuous film formation, and the contact resistance of the first electrode E1 and the second electrode E2 is small, which can better reduce the resistance of the first electrode.

For example, the electrode thin film E20 is formed by thermal evaporation or low-temperature sputtering process, and a portion of the metal film corresponding to the light-emitting region of the sub-pixel is removed by low-temperature exposure and low-temperature dry etching process to facilitate reducing the IR-Drop, caused by the sheet resistance, of the first electrode E1, and make the light-emitting region of the sub-pixel have high transmittance and improve the aperture ratio. For example, the electrode thin film E20 is a metal film with high conductivity, such as an aluminum film.

For example, etching the protective thin film and the electrode thin film at a temperature less than 110° C.

For example, forming the photoresist pattern at a temperature less than 110° C. For example, the photoresist pattern is formed using an exposure process.

For example, in the method for manufacturing the display panel provided by the embodiments of the present disclosure, low-temperature exposure (<110° C.) and low-temperature etching (<100° C.) have no poor effect on the light-emitting element (OLED component) that has been formed.

Figure 13E:
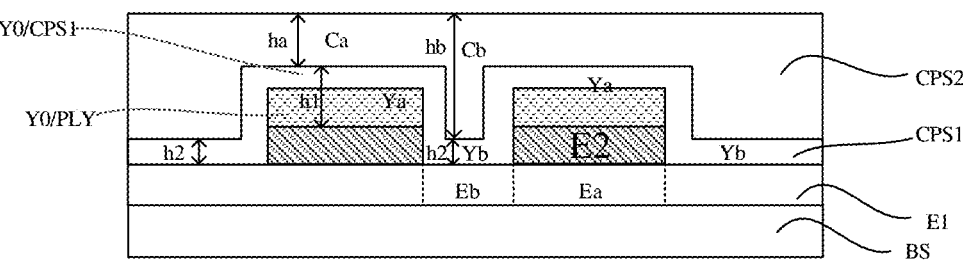

For example, as illustrated in FIG. 13E, the method for manufacturing the display panel further includes forming a first encapsulation thin film CPS1, the first encapsulation thin film CPS1 is in contact with the protective layer PLY, and the first encapsulation thin film CPS1 is in contact with the first electrode E1. The first encapsulation thin film CPS1 and the protective layer PLY constitute an inorganic layer Y0, the inorganic layer Y0 includes a first portion Ya and a second portion Yb, and the thickness of the first portion Ya of the inorganic layer Y0 is different from the thickness of the second portion Yb of the inorganic layer Y0.

For example, because the first portion Ya of the inorganic layer Y0 includes the protective layer PLY and the first encapsulation thin film CPS1, and the second portion Yb of the inorganic layer Y0 only includes the first encapsulation thin film CPS1, the thickness of the first encapsulation thin film CPS1 at various positions are substantially the same, the thickness at various positions are has little difference, and the thickness of the first portion Ya of the inorganic layer Y0 is greater than the thickness of the second portion Yb of the inorganic layer Y0.

Figure 14:
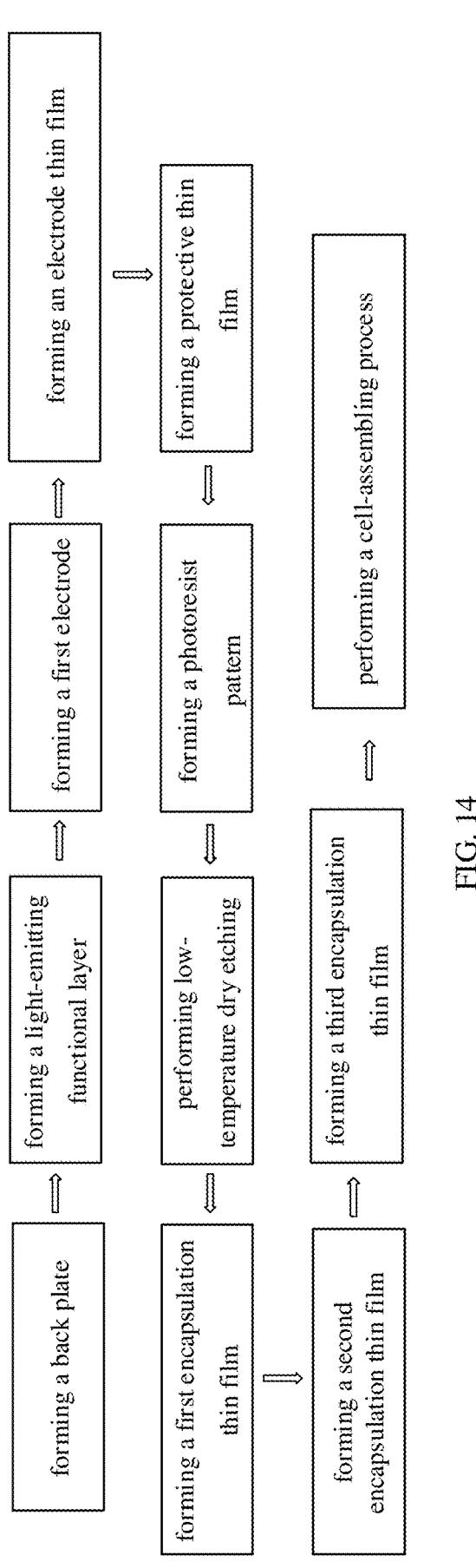
FIG. 14 is a schematic diagram of a method for manufacturing a display panel provided by an embodiment of the present disclosure.

FIG. 14 is a schematic diagram of a method for manufacturing a display panel provided by an embodiment of the present disclosure. As illustrated in FIG. 14, the method for manufacturing the display panel includes: forming a back plate; forming a light-emitting functional layer; forming a first electrode; forming an electrode thin film; forming a protective thin film; forming a photoresist pattern; performing low-temperature dry etching with the photoresist pattern as a mask and the first electrode as an etching stop layer; forming a first encapsulation thin film; forming a second encapsulation thin film; forming a third encapsulation thin film; and performing a cell-assembling process to form a display panel.

For example, as illustrated in FIG. 4 and FIG. 5, the black matrix BM and the color filter layer CF are formed on the cover plate CV to form a color filter substrate. The pixel circuit, the light-emitting element, and the encapsulation layer are formed on the base substrate BS to form an array substrate. For example, the array substrate and the color filter substrate are cell-assembled to form a display panel.

For example, referring to FIG. 4 and FIG. 5, a method for manufacturing a display panel provided by an embodiment of the present disclosure includes the following steps.

Step S11, forming a TFT array driving circuit (Oxide or LTPS) on a glass substrate.

Step S12, forming a top-emitting OLED component by vacuum evaporation and inkjet printing (IJP) processes.

Step S13, forming the first electrode E1 of the light-emitting element by using a low-temperature sputtering process.

Step S14, forming an electrode thin film (a metal film) by using a low-temperature sputtering process or a vacuum thermal evaporation process.

Step S15, forming one or more layers of protective thin films (thin film encapsulation protective layers) made of SiNx, SiOx and $Al_2O_3$ by chemical vapor deposition (CVD) or atomic layer deposition (ALD) process; the display substrate can be taken out from a vacuum chamber, and then a low-temperature exposure process and a low-temperature dry etching process are performed; for example, the dry etching process may be an inductively coupled plasma (ICP) dry etching process. For example, the temperature of all subsequent processes must be less than 110° C., the ICP etching of the protective thin film is performed first, and then the dry etching of the electrode thin film is performed; because the first electrode E1 (for example, the material of the first electrode E1 is indium zinc oxide, IZO) will not be etched simultaneously by the etching gas ($Cl_2$ and $BCl_3$, etc.), the first electrode E1 can be used as an etching stop layer for the electrode thin film to avoid damage to a part of the light-emitting element below the first electrode E1.

Step S16, after the etching process is completed, the multi-layer thin film encapsulation process of the thin film encapsulation layer (TFE) is used for protection, which can effectively prevent water and oxygen from invading the light-emitting element and improve reliability.

For example, after the ICP etching is performed, the light-emitting element (OLED component) is only protected by the first electrode E1 to isolate water and oxygen, so the light-emitting element should be put into the thin film encapsulation process as soon as possible.

For example, the removal process of the photoresist pattern adopts an ICP low-temperature ashing process, which can avoid the corrosion of the second electrode E2 caused by a stripping process.

For example, in the display panel provided by the embodiments of the present disclosure, the first electrode E1 is complete and flat, no etching damage is found, there is no residue at the etching hole of the second electrode E2, and the film layer of the first electrode E1 can block the etching of the dry etching reaction gas $Cl_2/BCl_3$ plasma of the electrode thin film, so the first electrode E1 (for example, IZO film) can be used as the etching stop layer of the second electrode E2; the first encapsulation thin film (e.g., SiONx of 8000 Å) needs to be formed at the etching hole, the first encapsulating thin film has good step coverage to cover the etched steps, and then the second encapsulating thin film is formed for flattening by using the solution process inkjet printing (IJP) process. For example, the second encapsulation thin film of 8 μm can achieve particle wrap, and can also planarize the etching hole; finally, a third encapsulation thin film is formed. For example, the third encapsulation thin film is a SiNx thin film to further protect the OLED component. For example, the thickness of the second encapsulation thin film is greater than or equal to 8 μm. For example, in some embodiments, the thickness of the second encapsulation thin film is smaller than or equal to 20 μm.

For the display panel provided by the embodiments of the present disclosure, under the high temperature and high humidity test and evaluation conditions (60° C./90% RH), the encapsulation effect of the encapsulation layer is good, and no new defects are found during the test process.

The display panel provided by the embodiments of the present disclosure has a simplified manufacturing structure, minimizes the thickness of the display panel, and improves the bending characteristic.

For example, the display panel provided by the embodiments of the present disclosure may be formed as a top-emitting structure, a bottom-emitting structure, or a double-sided display structure. The drawings of the embodiments of the present disclosure are illustrated by taking a top-emitting display panel of medium or large size as an example. For example, the display panel provided by the embodiments of the present disclosure can also form a transparent display, that is, ambient light can pass through the display panel provided by the embodiments of the present disclosure. The specific structure and display conditions of the display panel can be determined according to requirements.

At least one embodiment of the present disclosure further provides a display device, including any one of the above-mentioned display panels.

For example, the display device may be a display device such as an OLED, and any product or component with a display function such as a TV, a digital camera, a mobile phone, a watch, a tablet computer, a notebook computer, a navigator, etc. including the display device.

It should be noted that, for the sake of clarity, in the drawings used to describe the embodiments of the present disclosure, the thicknesses of layers or regions are enlarged. It can be understood that when a component such as a layer, film, region or substrate is referred to as being "on" or "under" another component, the component may be "directly" "on" or "under" another component, or one or more intermediate components may be interposed therebetween.

In the embodiments of the present disclosure, the patterning or patterning process may only include a photolithography process, or include a photolithography process and an etching step, or may include printing, inkjet and other processes for forming a predetermined pattern. The photolithography process refers to the process including film formation, exposure, development, etc., and using photoresist, mask plate, exposure machine, etc. to form patterns. A corresponding patterning process may be selected according to the structure formed in the embodiments of the present disclosure. In the case of no conflict, features in the same embodiment or in different embodiments of the present disclosure can be combined with each other.

What have been described above are only specific implementations of the present disclosure, the protection scope of the present disclosure is not limited thereto. Any changes or substitutions easily occur to those skilled in the art within the technical scope of the present disclosure should be within the protection scope of the present disclosure. Therefore, the protection scope of the present disclosure should be based on the protection scope of the claims.

What is claimed is:

1. A display panel, comprising:

a base substrate; and a plurality of sub-pixels, located on the base substrate, comprising a pixel circuit and a light-emitting element, wherein the light-emitting element is connected to the pixel circuit, the pixel circuit is configured to drive the light-emitting element, wherein the light-emitting element comprises:

a first electrode; and a second electrode, electrically connected to the first electrode, the first electrode is closer to the base substrate than the second electrode, wherein the display panel further comprises an inorganic layer, and the inorganic layer is configured to protect the light-emitting element, wherein the inorganic layer comprises a protective layer, and the protective layer is in direct contact with the second electrode, and wherein the inorganic layer further comprises a first encapsulation thin film, and the first encapsulation thin film is in direct contact with the first electrode.

2. The display panel according to claim 1, wherein the light-emitting element further comprises a third electrode and a light-emitting functional layer, the light-emitting functional layer is located between the third electrode and the first electrode, and the third electrode is closer to the base substrate than the first electrode, the light-emitting functional layer comprises a hole injection layer, a hole transport layer, a charge generating layer, a first light-emitting layer, a second light-emitting layer, a third light-emitting layer, and an electron transport layer that are stacked, the first light-emitting layer is configured to emit light of a first color, the second light-emitting layer is configured to emit light of a second color, and the third light-emitting layer is configured to emit light of a third color, the third light-emitting layer is provided at a side of the charge generating layer, and the first light-emitting layer and the second light-emitting layer are provided at a side of the charge generating layer opposite to a side of the charge generating layer where the third light-emitting layer is provided.

3. The display panel according to claim 1, further comprising a black matrix and a color filter layer, wherein the color filter layer comprises a plurality of color filter portions, the black matrix is configured to separate the plurality of color filter portions, and an orthographic projection of the second electrode on the base substrate at least partially overlaps with an orthographic projection of the black matrix on the base substrate.

4. The display panel according to claim 1, wherein the second electrode comprises a plurality of conductive lines and an opening region surrounded by the plurality of conductive lines, the light-emitting element comprises a light-emitting region, and an orthographic projection of the light-emitting region on the base substrate overlaps with an orthographic projection of the opening region on the base substrate.

5. A display panel, comprising:

a base substrate; and a plurality of sub-pixels, located on the base substrate, comprising a pixel circuit and a light-emitting element, wherein the light-emitting element is connected to the pixel circuit, the pixel circuit is configured to drive the light-emitting element, wherein the light-emitting element comprises:

a first electrode; and a second electrode, electrically connected to the first electrode, the first electrode is closer to the base substrate than the second electrode, wherein the second electrode comprises a plurality of conductive lines and an opening region surrounded by the plurality of conductive lines, the light-emitting element comprises a light-emitting region, and an orthographic projection of the light-emitting region on the base substrate overlaps with an orthographic projection of the opening region on the base substrate.

6. The display panel according to claim 5, further comprising an inorganic layer, wherein the inorganic layer is configured to protect the light-emitting element, the inorganic layer comprises a first portion and a second portion, and a thickness of the first portion of the inorganic layer is different from a thickness of the second portion of the inorganic layer.

7. The display panel according to claim 2, wherein the first portion of the inorganic layer overlaps with the second electrode in a direction perpendicular to the base substrate, the second portion of the inorganic layer does not overlap with the second electrode in the direction perpendicular to the base substrate, and the thickness of the first portion of the inorganic layer is greater than the thickness of the second portion of the inorganic layer.

8. The display panel according to claim 6, wherein the inorganic layer comprises a protective layer, and the protective layer is in direct contact with the second electrode.

9. The display panel according to claim 8, wherein the inorganic layer further comprises a first encapsulation thin film, and the first encapsulation thin film is in direct contact with the first electrode, wherein the first encapsulation thin film is in direct contact with the protective layer, and the first encapsulation thin film is in direct contact with the second electrode.

10. The display panel according to claim 9, wherein materials of the protective layer and the first encapsulation thin film comprise inorganic insulating materials.

11. The display panel according to claim 9, further comprising a second encapsulation thin film, wherein the second encapsulation thin film is located on the first encapsulation thin film and is in contact with the first encapsulation thin film, a material of the second encapsulation thin film comprises an organic material, the second encapsulation thin film comprises a first portion and a second portion, and a thickness of the first portion of the second encapsulation thin film is different from a thickness of the second portion of the second encapsulation thin film, wherein the first portion of the second encapsulation thin film is in contact with the first portion of the inorganic layer, the second portion of the second encapsulation thin film is in contact with the second portion of the inorganic layer, and the thickness of the first portion of the second encapsulation thin film is smaller than the thickness of the second portion of the second encapsulation thin film.

12. The display panel according to claim 11, further comprising a third encapsulation thin film, wherein the third encapsulation thin film is located on the second encapsulation thin film, and a thickness of the first encapsulation thin film is greater than a thickness of the third encapsulation thin film.

13. The display panel according to claim 5, wherein a ratio of an overlapping area of an orthographic projection of the second electrode on the base substrate and the orthographic projection of the light-emitting region on the base substrate to an area of the orthographic projection of the light-emitting region on the base substrate is less than 10%.

14. The display panel according to claim 5, wherein the second electrode further comprises a plurality of conductive blocks, and the plurality of conductive blocks are electrically connected to the plurality of conductive lines, the plurality of conductive lines comprise a first conductive line extending in a first direction and a second conductive line extending in a second direction, a dimension of each of the plurality of conductive blocks in the first direction is larger than a dimension of the second conductive line in the first direction, a dimension of the conductive block in the second direction is larger than a dimension of the first conductive line in the second direction, and the first direction intersects with the second direction.

15. The display panel according to claim 14, further comprising a plurality of pixel regions, wherein the plurality of pixel regions are arranged in an array, each of the plurality of pixel regions comprises a pixel group and a reserved region, and the pixel group comprises at least three sub-pixels among the plurality of sub-pixels, and the conductive block corresponds to the reserved region, wherein the plurality of sub-pixels comprises a first sub-pixel, a second sub-pixel, and a third sub-pixel, and the pixel group comprises the first sub-pixel, the second sub-pixel, and the third sub-pixel, the first sub-pixel, the second sub-pixel, and the third sub-pixel are arranged sequentially, an area of the light-emitting region of the second sub-pixel is smaller than an area of the light-emitting region of the first sub-pixel, the light-emitting region of the first sub-pixel is provided with a first notch, and the first notch is close to the light-emitting region of the second sub-pixel, and the reserved region comprises a first reserved region, and the first reserved region is located at a side of the light-emitting region of the second sub-pixel and occupies a position of the first notch, wherein an area of the first reserved region is greater than one third of the area of the light-emitting region of the second sub-pixel and smaller than or equal to the area of the light-emitting region of the first sub-pixel.

16. The display panel according to claim 15, wherein the plurality of sub-pixels further comprises a fourth sub-pixel, the fourth sub-pixel and the second sub-pixel are arranged at both sides of the third sub-pixel, respectively, and an area of the light-emitting region of the fourth sub-pixel is smaller than an area of the light-emitting region of the third sub-pixel, the light-emitting region of the third sub-pixel is provided with a second notch, and the second notch is close to the light-emitting region of the third sub-pixel, and the reserved region further comprises a second reserved region, and the second reserved region is located at a side of the light-emitting region of the fourth sub-pixel and occupies a position of the second notch, wherein an area of the second reserved region is greater than one third of the area of the light-emitting region of the fourth sub-pixel and smaller than or equal to the area of the light-emitting region of the third sub-pixel.

17. A display device, comprising the display panel according to claim 5.

18. A method for manufacturing a display panel, comprising:

forming a plurality of sub-pixels on a base substrate, wherein forming the plurality of sub-pixels comprises forming a pixel circuit and forming a light-emitting element, the light-emitting element is connected to the pixel circuit, and the pixel circuit is configured to drive the light-emitting element, wherein forming the light-emitting element comprises:
forming a first electrode; and
forming a second electrode, wherein the second electrode is electrically connected to the first electrode, and the first electrode is closer to the base substrate than the second electrode, wherein forming the second electrode comprises:
forming an electrode thin film on the first electrode;
forming a protective thin film on the electrode thin film;
forming a photoresist pattern on the protective thin film; and
using the photoresist pattern as a mask and using the first electrode as an etching stop layer, patterning the protective thin film and the electrode thin film by using a same patterning process to form a protective layer and form the second electrode.

19. The method for manufacturing the display panel according to claim 18, wherein the forming the photoresist pattern is performed at a temperature less than 110° C., and etching the protective thin film and the electrode thin film is performed at a temperature less than 110° C.

20. The method for manufacturing the display panel according to claim 18, further comprising forming a first encapsulation thin film, wherein the first encapsulation thin film is in contact with the protective layer, the first encapsulation thin film is in contact with the first electrode, the first encapsulation thin film and the protective layer constitute an inorganic layer, the inorganic layer comprises a first portion and a second portion, and a thickness of the first portion of the inorganic layer is different from a thickness of the second portion of the inorganic layer.

* * * * *